United States Patent [19]

Wittlinger

[11] 3,835,410

[45] Sept. 10, 1974

[54] CURRENT AMPLIFIER

[75] Inventor: Harold Allen Wittlinger, Pennington, N.J.

[73] Assignee: RCA Corporation, New York, N.Y.

[22] Filed: Dec. 26, 1972

[21] Appl. No.: 318,645

[52] U.S. Cl. .......................... 330/19, 330/18, 330/22
[51] Int. Cl. ........................................... H03f 3/42
[58] Field of Search .......................... 330/18, 19, 22

[56] References Cited

UNITED STATES PATENTS 3,531,730 9/1970 Steckler .......................... 330/19 X

FOREIGN PATENTS OR APPLICATIONS 1,141,338 12/1962 Germany .......................... 330/22 X

*Primary Examiner*—John Kominski
*Assistant Examiner*—Lawrence J. Dahl

[57] ABSTRACT

A three-terminal current amplifier has a current gain substantially independent of the forward current gains of its component transistors. It employs a first transistor with collector-to-base feedback regulating its collector current flow to equal applied input current and a second transistor having a base emitter circuit in parallel with that of the first transistor. Output current from the collector electrode of the second transistor consequently is proportional to the input current. Means are provided for maintaining the collector potentials of the first and second transistors substantially equal to help maintain a fixed relationship between the output and input current amplitudes.

6 Claims, 3 Drawing Figures

CURRENT AMPLIFIER

BACKGROUND OF THE INVENTION

A "current amplifier" insofar as this application is concerned is an active circuit having an output current related to and responsive to an input current over a portion of their ranges and need not exhibit current gain. The input and output currents may be quiescent currents or may exhibit variations. Those circuits commonly denominated "current mirrors" are included within the category "current amplifier" as defined hereabove.

Three-terminal current amplifiers are known of the type in which first and second transistors have their emitter electrodes direct current conductively coupled to the amplifier common-terminal; their respective collector electrodes direct current conductively coupled to the input and the output amplifier terminals, respectively, and their joined base electrodes direct coupled to the amplifier input terminal. Such a prior art current amplifier operates in the following manner. The first transistor regulates its collector current by means of its collector-to-base negative feedback connection to be substantially equal to the input current. Because of the parallel connection of the base-emitter circuits of the first and second transistors, the second transistor delivers a collector current as output current proportional to the collector current of the first transistor.

The prior art current amplifiers have no provision to maintain the collector potentials of their first and second transistors substantially equal under all conditions of conduction. Such provision is desirable to remove the effects of dissimilar collector potentials which undesirably affect the proportioning of the output and input currents of the current amplifier. It is desirable that the proportioning of the current amplifier output and input currents be determined solely by the relative geometries of the first and second transistors and, in particular, by their relative effective base-emitter junction areas.

SUMMARY OF THE INVENTION

The present invention is embodied in a current amplifier having first and second transistors with parallelly connected base emitter circuits; having input and output terminals connected by first and second direct current conductive coupling paths respectively to their collector electrodes; and having means for regulating the collector current flow of the first transistor to be substantially equal to input current received at the input terminal, which means includes similar direct coupling from the input terminal to each of the base terminals of the first and second transistors. Means are included in the first and second direct current conductive coupling paths for equalizing potentials at the collector electrodes of the first and second transistors to within substantially less than the offset potential of a forward biased semiconductor junction.

BRIEF DESCRIPTION OF THE DRAWINGS

The present invention is illustrated in the accompanying drawing in which.

DETAILED DESCRIPTION

Figure 1:
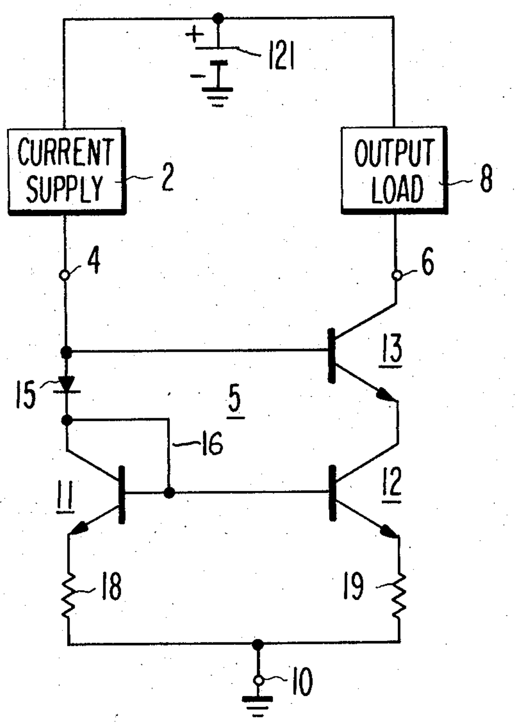
FIG. 1 is a schematic diagram of a current amplifier ambodying the present invention.

Referring to FIG. 1, the illustrated current amplifier is particularly well suited to construction within an integrated circuit, since it is desirable that there be thermal coupling between transistors 11 and 12 therein. Input current from the current supply 2 is applied to the input terminal 4 of a current amplifier 5. The amplifier produces at its output terminal 6 an output current proportional to the input current, which current is applied to an output load 8. The common terminal 10 of the current amplifier 5 is shown connected at a ground reference potential, and a source of potential 121 provides a reference potential offset from ground to the current supply and to the output load 8.

The current amplifier 5 includes transistors 11, 12 and 13 of similar conductivity type. A semiconductor diode 15 provides a path from input terminal 4 for the collector current of transistor 11 and base currents of transistors 11 and 12. The collector-to-base negative feedback connection 16 of transistor 11 regulates the collector current flow of transistor 11 to be essentially equal to the input current provided by the current supply 2 to terminal 4, less the base currents of transistors 11, 12 and 13. The emitter current flow in the transistor 11 required to support this collector current will determine the potential at the base electrodes of the transistors 11 and 12. This potential will be equal to the potential drop across the resistor 18 and the base-emitter offset potential of the transistor 11 for the level of this emitter current. If transistor 12 is provided with an emitter degeneration resistor 19 having a resistance related to that of resistor 18 in reverse proportion to the ratio of the effective base-emitter junction areas of transistors 11 and 12, it is well-known that the ratio of the collector current of transistor 12 to that of transistor 11 will be the same as the ratio of their effective base-emitter junction areas. Therefore, the proportionality between the collector current of transistors 12 and 11 can be determined purely by the geometry of the devices constructed in integrated circuit form. A plurality of transistors with joined base electrodes, joined emitter electrodes, and joined collector electrodes will provide a composite transistor with increased effective base-emitter junction area. In the event that the resistances of the emitter resistors 18 and 19 are substantially zero, comprising only bulk resistance, contact resistance and lead-wire resistance, this proportionality of collector currents of transistors 12 and 11 will obtain in any case.

The collector current flow of transistor 13, which transistor is the common base transistor amplifier portion of a cascade combination between transistors 13 and 12, is equal to the collector current flow of transistor 12, less the base current of transistor 13. The latter is a component of the collector current of transistor 12 but not of the collector current of transistor 13. The output current provided by the current amplifier 5 from its terminal 6 is identical to the collector current of transistor 13, except for a sign reversal to accomodate the fact that the direction of actual current flow for an NPN transistor is contrary to the presumed direction of output current flow.

The coupling between input terminal 4 and each of the collector electrodes of transistors 11 and 12, is such that the potentials of these collector electrodes will remain substantially equal during circuit operation. This is important because it helps insure that the ratio of the transconductance of the two transistors will remain fixed. This is desirable to insure that the current gain of the amplifier is unaffected by variations of potential appearing at its input terminal or output terminal. The discussion which follows shows why these collectors remain at equal potentials.

The collector potentials of transistors 11 and 12 are each determined with respect to the potential at the input terminal 4. The collector potential of transistor 11 will be less positive than that at input terminal 4 by an amount equal to the offset potential across the diode 15, which diode is forward-biased by the collector current of transistor 11. The collector potential of the transistor 12 will be less positive than the potential at the input terminal 4 by an amount equal to the offset potential across the base-emitter junction of transistor 13, which junction is forward-biased by the collector current of transistor 12. The offset potentials across forward-biased semiconductor junctions of the same material are substantially equal despite differences in their geometries and the densities of current flowing through each of them. Therefore, the collector potentials of transistors 11 and 12 are substantially equal to each other.

This equality can be improved, if desired, by proportioning the effective junction areas of the diode 15 and the base emitter junction of transistor 13 to be related in the same proportion as the collector currents of transistors 11 and 12. That is to say, the densities of current flow in the forward-biased junction of 15 and the base-emitter junction of transistor 13 can be made to be similar to each other, so that their offset potentials are even more nearly alike.

Since the collector potentials of both transistors 11 and 12 are substantially equal, as well as their base potentials and their emitter potentials, these transistors operate over substantially identical portions of their operating characteristics. This permits the proportioning of their collector currents, as determined by the proportioning of the relative areas of their base-emitter junctions, to be made more accurate. Also, when this is done, the substantially equal operating voltages on the transistors 11 and 12 causes the power dissipation in each of these transistors to be proportional to the areas. Consequently, the temperatures of the transistors 11 and 12 can be made more alike than otherwise would be the case. This similarity of temperatures also improves the proportioning of the transconductances of the transistors 11 and 12 to be equal to the ratio of their effective base-emitter junction areas.

Figure 2:
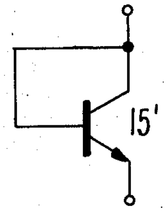
FIG. 2 shows, in schematic form, one way of realizing the semiconductor diode shown in FIG. 1.

FIG. 2 shows one means of realizing the semiconductor diode 15. It may comprise a transistor 15', of the same conductivity type as transistor 11, having its base electrode direct coupled from its collector electrodes, with its collector and emitter electrodes respectively providing the anode and cathode of the semiconductor diode 15. Proportioning the effective base-emitter areas of the transistors 12 and 13 to be alike and of the transistors 11 and 15 to be alike will provide substantially optimum matching of the collector potentials of transistors 11 and 12.

Figure 3:
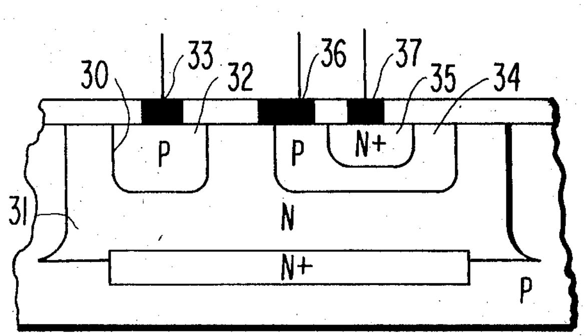
FIG. 3 is a diffusion profile illustrating an alternative means for realizing that semiconductor diode.

FIG. 3 shows how the semiconductor diode 15 may be realized more economically within a monolithic integrated circuit structure. The semiconductor diode 15 is provided by a junction 30 formed between a collector region 31 and region 32 of opposite conductivity type therein, formed by subsequent diffusion. No ohmic contact need be made between the cathode region of diode 15 and the collector region of transistor 11 since they are identical, comprising the region 31 of N-type material. An ohmic contact 33 with region 32 provides access to the anode of diode 15. (A diode forward biased by collector current can be realized in a lateral PNP transistor also by diffusion of the diode cathode region into the transistor collector region, when the current amplifier 5 is constructed with PNP rather than NPN transisistors). The transistor 11 comprises, in addition to its collector region 31, a base region 34 and an emitter region 35. An ohmic contact 36 contacts regions 31 and 34 providing the connection 16 and providing for connection to the base electrode of transistor 12. An ohmic contact 37 is provided for emitter region 35.

Certain modifications of the basic structure are permissible within the spirit and scope of the present invention. The transistor 13 and diode-connected transistor 15' may, for example, comprise composite transistors each formed by a Darlington cascade connection. Further, while the direct coupling means 16 is shown as a direct connection it may be replaced by an emitter follower, a resistor, a forward-biased diode or a reverse-biased diode.

The base electrodes of transistors 11 and 12 may be direct coupled from the input terminal 4 by means other than the direct coupling means 16 and diode 15 — for instance, by emitter-follower or by a diode. Those configurations shown in my RCA Corporation Technical Note No. 914 entitled "Current Mirror Amplifier Circuits" and mailed Aug. 24, 1972, are considered to be within the scope of the present invention.

While the invention is illustrated in terms of a two-transistor (11 and 12) amplifier (aside from elements 13 and 15) it is to be understood that it is equally applicable to other well understood equivalents. For example, the transistor 12 may, in practice, be two or three or more parallel conducted transistors and the transistor 11 a single transistor. Further, the construction may be such that the base emitter area of transistor 12 is substantially greater than (or less than) that of transistor 11. All of this will affect the current gain of the amplifier, however, the principle of operation, the improvement achieved with the present invention is not affected.

The term "semiconductor diode" in the claims comprehends a diode-connected transistor, and the term transistor herein and in the claims comprehends composite transistors formed by the interconnection of component transistors.

What is claimed is:

1. In a current amplifier which includes input, common and output terminals; a first and a second transistors of like conductivity type having their emitter electrodes direct current conductively coupled via said common terminal to a reference potential, each having a base electrode and having their collector electrodes respectively connected by first and second direct current conductive coupling paths respectively to said input terminal and to said output terminal; means for regulating collector current flow of said first transistor to be substantially equal to input current received at said input terminal, said means including similar direct coupling of said input terminal to each of said base electrodes of said first and said second transistors; and means for receiving output current flow connected to said output terminal, said output current flow substantially equal to the collector current flow of said second transistor, the improvement comprising:

a third transistor of the same conductivity type as said first and second transistors, said third transistor having a base electrode and having an emitter electrode-to-collector electrode path, said second direct current conductive coupling path comprising said emitter electrode-to-collector electrode path connected in a sense to conduct the collector-to-emitter current of said second transistor; and means for maintaining the collector electrodes of said first and second transistors at substantially the same potential, comprising means coupled to the base electrode of said third transistor for establishing it at a potential which differs from that at the collector electrode of said first transistor by an amount substantially equal to that between the base electrode of said third transistor and the collector electrode of said second transistor.

2. The combination of:

a two-transistors current amplifier, each transistor having a base, an emitter and a collector, said bases being connected to one another and said emitters being connected to a point of reference potential, and said amplifier including a negative feedback connection between said bases and the collector of the first of said transistors;

an input terminal;

an output terminal;

a first diode connected in the forward direction between said input terminal and the collector of the first of said transistors; and a second diode connected in the forward direction between said input terminal and the collector of the second of said transistors.

3. A circuit as set forth in claim 2 wherein said second diode comprises the base-emitter diode of a third transistor of the collector of which connects to said output terminal.

4. A circuit as set forth in claim 2 wherein said feedback connection comprises a direct conductive connection.

5. In a current amplifier as set forth in claim 1, said means for maintaining the collector electrodes of said first and second transistors at substantially the same potential comprising:

a connection from said base electrode of said third transistor to said input terminal; and semiconductor diode means in said first direct current conductive coupling path, connected to conduct the collector current of said first transistor in the forward direction.

6. In a current amplifier as set forth in claim 5, said semiconductor diode means comprising:

a fourth transistor having base, emitter and collector electrodes, of the same conductivity as the remaining transistors, and connected collector electrode to base electrode so that it operates as a diode.

* * * * *